(12) United States Patent
Hayasaki

(10) Patent No.: US 8,441,232 B2
(45) Date of Patent: May 14, 2013

(54) ELECTRONIC APPARATUS AND DISPLAY METHOD OF REMAINING BATTERY LEVEL

(75) Inventor: Hiromi Hayasaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 449 days.

(21) Appl. No.: 11/853,644

(22) Filed: Sep. 11, 2007

(65) Prior Publication Data
US 2008/0067979 A1 Mar. 20, 2008

(30) Foreign Application Priority Data

Sep. 15, 2006 (JP) ................................ 2006-251153

(51) Int. Cl.
H02J 7/00 (2006.01)
H02J 7/04 (2006.01)

(52) U.S. Cl.
USPC ............ 320/132; 320/DIG. 18; 320/DIG. 19; 320/DIG. 21; 320/134; 320/136; 320/148; 320/149; 320/151

(58) Field of Classification Search .................. 320/134, 320/136, 106, 135, 137, 132, DIG. 18, DIG. 19, 320/DIG. 21, 148, 149, 150, 160, 161
See application file for complete search history.

(56) References Cited

U.S. PATENT DOCUMENTS

| 5,596,260 | A | * | 1/1997 | Moravec et al. | 320/135 |
| 5,838,139 | A | * | 11/1998 | Greene | 320/133 |
| 6,087,808 | A | * | 7/2000 | Pritchard | 320/132 |
| 6,529,840 | B1 | * | 3/2003 | Hing | 702/63 |
| 7,382,270 | B2 | * | 6/2008 | Wendelrup et al. | 340/636.1 |
| 7,541,775 | B2 | * | 6/2009 | Lee | 320/132 |
| 7,619,389 | B2 | * | 11/2009 | Wanibuchi | 320/128 |
| 2003/0141849 | A1 | * | 7/2003 | Kobayashi et al. | 320/136 |
| 2004/0005497 | A1 | * | 1/2004 | Nunomaki et al. | 429/92 |

FOREIGN PATENT DOCUMENTS

| JP | 2000-092721 A | 3/2000 |
| JP | 2003-009407 A | 1/2003 |
| JP | 2004-333518 A | 11/2004 |

* cited by examiner

Primary Examiner — Edward Tso
Assistant Examiner — Alexis Boateng
(74) Attorney, Agent, or Firm — Canon U.S.A., Inc. IP Division

(57) ABSTRACT

The electronic apparatus allows a user to arbitrarily set a display of a remaining battery level. The apparatus includes a detector which detects a remaining battery level of a battery, and a threshold-value-setting part which is operated by a user to set a threshold value for performing a display relating to the remaining battery level. The apparatus further includes a controller which displays in a display device an image representing the remaining battery level in accordance with the result of a comparison between the remaining battery level detected by the detector and the threshold value set with the threshold-value-setting part.

6 Claims, 9 Drawing Sheets

ROTATE MAIN DIAL ONE CLICK TO RIGHT

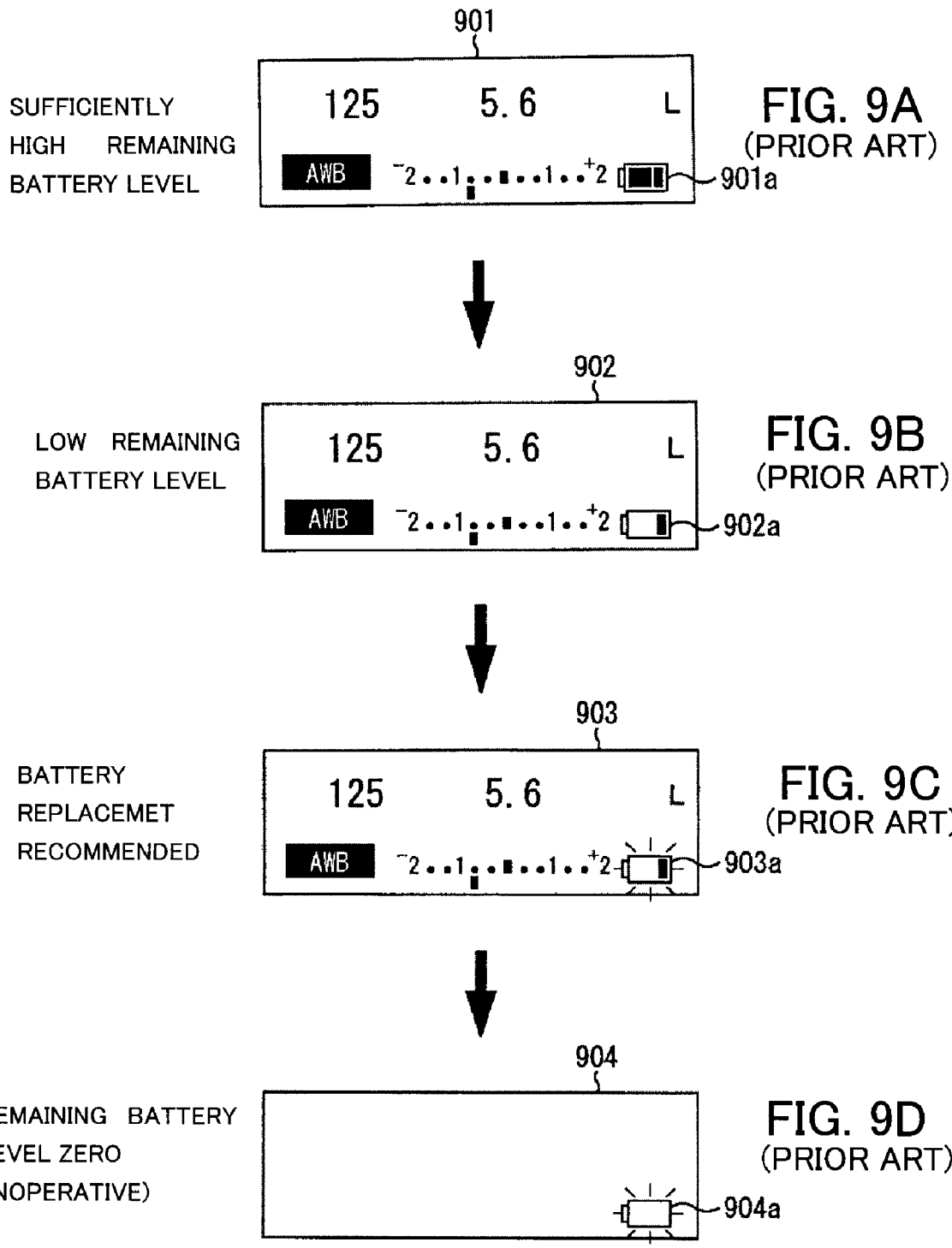

ELECTRONIC APPARATUS AND DISPLAY METHOD OF REMAINING BATTERY LEVEL

BACKGROUND OF THE INVENTION

1. Field of the Invention

The present invention relates to an electronic apparatus and a display method of a remaining battery level preferable for use in an electronic apparatus.

2. Description of the Related Art

Conventionally, electronic apparatuses such as digital cameras have provided a notification of a remaining battery level for a user through an indication on a display device. In Japanese Patent Laid-Open No. 2003-9407, the degradation of a secondary battery is estimated and the remaining battery level is displayed on the basis of the estimated degradation. In a cellular phone disclosed in Japanese Patent Laid-Open No. 2000-92721, one of a plurality of threshold value tables is selected with reference to temperature and a call status such as during a call and on standby, a threshold value in the selected threshold value table is compared with the battery state at that point, and the remaining battery level is displayed on the basis of the comparison result.

In Japanese Patent Laid-Open No. 2004-333518, battery voltage is detected a plurality of times, the future movements in voltage are predicted from the detected battery voltage, and a threshold value is set for determining the state of the battery based on the predicted voltage movements.

An example display of a remaining battery level will hereinafter be described by using a digital camera as an example. FIGS. 9A to 9D show example displays of a remaining battery level in a digital camera.

The digital camera detects a remaining battery level to measure the current remaining battery level. The digital camera compares the measured current remaining battery level with a threshold value previously set on a storage medium such as an EEPROM, and displays the remaining battery level based on the comparison result in a simple manner on a display device such as a liquid crystal display device.

FIG. 9A shows a display when the remaining battery level is sufficiently high. As shown in FIG. 9A, the high remaining battery level is simply displayed by showing a battery mark 901a filled in with black at the lower right in a liquid crystal display screen 901.

FIG. 9B shows a display when the remaining battery level is low. As shown in FIG. 9B, the low remaining battery level is displayed by showing a battery mark 902a partially blacked in a liquid crystal display screen 902.

FIG. 9C shows a display when the remaining battery level is approaching zero and a user is notified of the need of battery replacement. As shown in FIG. 9C, the need of battery replacement is notified to the user to attract attention by showing a battery mark 903a flashing in a liquid crystal display screen 903.

FIG. 9D shows a display when the remaining battery level is zero and the digital camera is inoperative. As shown in FIG. 9D, the zero remaining battery level is displayed by showing the outline of a battery mark 904a and flashing it in a liquid crystal display screen 904.

In the conventional technique for displaying the remaining battery level, however, the displays of the remaining battery level are switched at the previously set points. Both for a user who wishes to change the battery when the remaining battery level is still high and for a user who wishes to change the battery only after the remaining battery level is low, the need of battery replacement is displayed at the same point. Thus, the conventional technique cannot achieve the display of the remaining battery level that matches the preference of a user or arbitrarily.

SUMMARY OF THE INVENTION

The present invention provides an electronic apparatus which allows a user to arbitrarily set a display of a remaining battery level and a display method of a remaining battery level for the electronic apparatus.

According to an aspect, the present invention provides an electronic apparatus including a detector which detects a remaining battery level of a battery, a threshold-value-setting part which is operated by a user to set a threshold value for performing a display relating to the remaining battery level, and a controller which displays in a display device an image representing the remaining battery level in accordance with the result of a comparison between the remaining battery level detected by the detector and the threshold value set with the threshold-value-setting part.

According to another aspect, the present invention provides a method of displaying a remaining battery level in an electronic apparatus. The method includes the steps of detecting a remaining battery level of a battery, setting a threshold value for performing a display relating to the remaining battery level based on operation of a user, and displaying in a display device an image representing the remaining battery level in accordance with the result of a comparison between the detected remaining battery level and the set threshold value.

Other embodiments, features and aspects of the present invention will become apparent from the following description and the attached drawings.

BRIEF DESCRIPTION OF THE DRAWINGS

FIGS. 9A to 9D show example displays of a remaining battery level in a conventional digital camera.

DESCRIPTION OF THE EMBODIMENTS

Various embodiments, features and aspects of the present invention will now herein be described with reference to the accompanying drawings.

First Exemplary Embodiment

A first exemplary embodiment the present invention will hereinafter be described with reference to FIGS. 1 to 5. Description will be made by using a digital camera as an example of an electronic apparatus.

Figure 1:
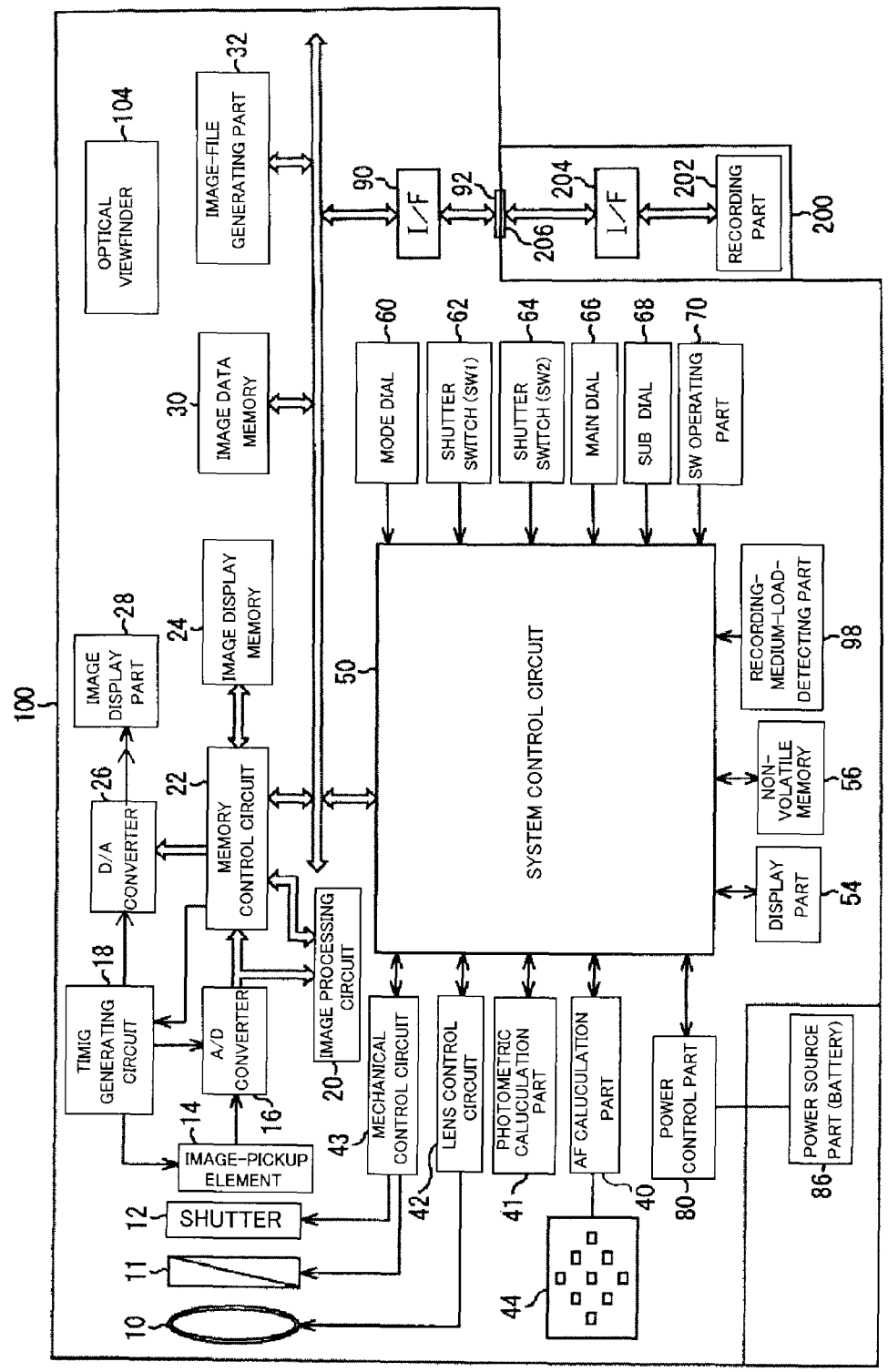
FIG. 1 is a block diagram showing an example configuration of a digital camera according to a first exemplary embodiment of the present invention.

FIG. 1 shows an example of the configuration of the digital camera. First, the configuration of a digital camera body 100 will be described. An external interchangeable image-pickup lens is mounted on a lens mount part 10. The lens mounted on the lens mount part 10 is controlled by a lens control circuit 42.

A light flux passes through the lens and impinges on a mirror 11. The mirror 11 is controlled by a mechanical control circuit 43. The light flux impinging on the mirror 11 is introduced to an optical viewfinder 104, an AF calculation part 40, and a photometric calculation part 41. A shutter 12 includes a front curtain and a rear curtain. The shutter 12 is controlled by the mechanical control circuit 43.

An image-pickup element 14 is provided for converting an optical image into an electronic signal and is formed of a CCD sensor or a CMOS sensor, for example. An A/D converter 16 converts an analog signal output from the image-pickup element 14 into a digital signal.

A timing generating circuit 18 provides a clock signal and a control signal for the image-pickup element 14, the A/D converter 16, and a D/A converter 26. The timing generating circuit 18 is controlled by a memory control circuit 22 and a system control circuit 50.

An image processing circuit 20 performs predetermined pixel interpolation processing and color conversion processing on image data output from the A/D converter 16 or image data output from the memory control circuit 22. The image processing circuit 20 performs predetermined calculation processing with the picked-up image data and performs AWB (auto white balance) processing in a TTL method based on the calculation results.

The memory control circuit 22 controls the A/D converter 16, the timing generating circuit 18, the image processing circuit 20, an image display memory 24, the D/A converter 26, an image data memory 30, and an image-file-generating part 32.

The image data output from the A/D converter 16 is then written to the image display memory 24 or the image data memory 30 via the image processing circuit 20 and the memory control circuit 22. The image data output from the A/D converter 16 may be written into the image display memory 24 or the image data memory 30 via the memory control circuit 22, not via the image processing circuit 20.

The image data for display written to the image display memory 24 is then output to an image display part (display device) 28 via the D/A converter 26 and is displayed by the image display part 28. The image display part 28 is provided on the back of the camera. The image display part 28 is used to show a picked-up image for a user or to notify various information based on the result of communication with the system control circuit 50. The image display part 28 having such functions is formed of an LCD, for example.

The image data memory 30 is provided for storing picked-up still images or moving images. The image data memory 30 can also be used as a work area of the system control circuit 50.

The image-file-generating part 32 compresses/decompresses image data into files. The image-file-generating part 32 reads the image data stored in the image data memory 30, performs compression or decompression thereof, and writes the processed data to the image data memory 30. The image-file-generating part 32 converts the image data of R, G, and B stored in the image data memory 30 into YC data formed of a luminance signal Y and a color-difference signal C. The image-file-generating part 32 compresses the YC data, for example in JPEG format, to provide an image file.

The compressed image data is read from the image data memory 30 and is output to the image display part 28 for display as a thumbnail image. The compressed image data is read continuously from the image data memory 30 and displayed in order in the image display part 28 for display as an index image (multi-image).

The lens control part 42 controls focusing of the lens. Specifically, the lens control part 42 drives the lens according to the result of operation of the AF calculation part 40 based on the information on a focus detection area selected from a group of focus detection areas 44, for example.

The system control circuit 50 generally controls the digital camera body 100. The system control circuit 50 includes a microcomputer containing a CPU, ROM, RAM, A/D converter, and D/A converter.

A display part 54 includes a liquid crystal display, a speaker and the like. The liquid crystal display shows an operational state, a message and the like with letters, images, and sounds in accordance with the execution result of programs in the system control circuit 50. A single or a plurality of display parts 54 are provided at positions which are easy to see close to an operation part of the digital camera body 100. Specifically, the display part 54 includes an LCD, an LED, and a sound-generating element, for example.

Some of functions of the display part 54 are provided within the optical viewfinder 104. Of data items displayed on the display part 54, a remaining battery level, later described, is displayed on the LCD provided on the outer surface of the camera body 100.

The optical viewfinder 104 is provided for allowing image pickup without using an image-monitoring function with the image display part 28. Information on various types of image pickup is displayed in the optical viewfinder 104.

A non-volatile memory 56 is formed of an EEPROM, for example. A mode dial 60 is a dial (operation member) for allowing a user to set an image-pickup mode such as a Tv priority, an Av priority, and a program mode. A shutter switch (SW1) 62 is turned on during the operation of a shutter button. When the shutter switch (SW1) 62 is turned on, the system control circuit 50 provides an instruction to start operation such as AF (auto focus) processing, AE (auto exposure control) processing, and AWB (auto white balance) processing.

A shutter switch (SW2) 64 is turned on upon completion of operation of the shutter button. When the shutter switch (SW2) 64 is turned on, the system control circuit 50 provides an instruction to start operation of a series of processing including exposure, image pickup, and recording. The exposure is processing of writing image data to the image data memory 30 via the image-pickup element 14, the A/D converter 16, and the memory control circuit 22. The image pickup is calculation processing in the image processing circuit 20 and the memory control circuit 22 and processing using the result of the calculation processing. The recording is processing of compressing the image data read from the image data memory 30 by the image-file-generating part 32 and writing the compressed data on a recording medium 200.

A main dial 66 is provided for allowing a user to set exposure compensation, a Tv value, and an Av value. A sub dial 68 is provided on the back of the camera and is used by a user to select a setting value displayed on the image display part 28 or to set various setting values.

A SW operating part 70 includes various buttons, for example a MENU button and a SET button. When the MENU button is pushed by a user, a menu mode is entered. More detailed settings can be made in the menu mode. Each of the settings is selected by a user pushing the SET button.

The operations in the mode dial 60, the shutter switch (SW1) 62, the shutter switch (SW2) 64, the main dial 66, the sub dial 68, and the SW operating part 70 are input to the system control circuit 50. The system control circuit 50 provides various operation instructions based on the operations input thereto.

As described later, the main dial 66, the sub dial 68, and the SW operating part 70 are also used as a threshold-value-setting part when a user changes threshold values VH and VM for switching between displays relating to a remaining battery level.

An interface (I/F) 90 serves as an interface between the recording medium 200 such as a memory card and a hard disk and the digital camera body 100. A connector 92 is provided for connection between the recording medium 200 and the interface 90.

A power control part 80 includes a battery detecting circuit, a DC-DC converter, a switch circuit for switching between energizing blocks, and the like. The power control part 80 detects the presence or absence of a loaded battery, the type of the battery, and the remaining battery level. The power control part 80 controls the DC-DC converter based on the detection result and the instruction from the system control circuit 50 and supplies necessary voltages to various parts including the recording medium 200 over a necessary time period. A power source part 86 includes a battery. The battery may be a primary battery such as an alkaline cell and a lithium cell or a secondary battery such as a NiCd battery, a NiMH battery, and a Li battery.

The recording medium 200 includes a recording part 202 formed of a semiconductor memory or an optical disk, an interface 204 to the digital camera body 100, and a connector 206 for connection with the digital camera body 100. The removal or load of the recording medium 200 from or on the digital camera body 100 is detected by a recording-medium-load-detecting part 98.

Figure 2:
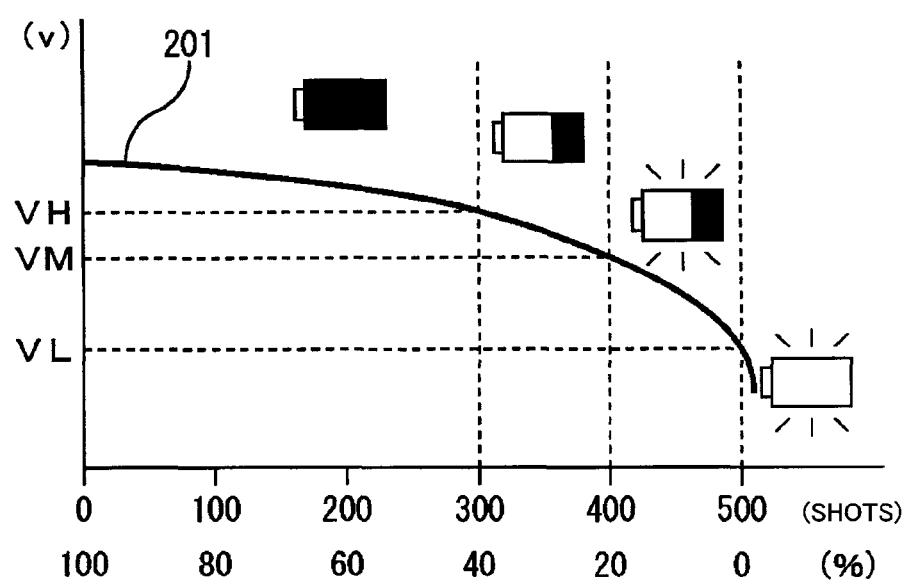
FIG. 2 is a graph showing the relationship between a discharge characteristic curve (discharge curve) of a battery and the number of picked-up images according to the first exemplary embodiment of the present invention.

FIG. 2 is a graph showing the relationship between a discharge characteristic curve (discharge curve) 201 of the battery and the number of picked-up images. In FIG. 2, the horizontal axis represents the number of picked-up images (shots). Under the number of picked-up images, the proportion of the possible number of picked-up images to the total number of picked-up images is shown in percentage (%).

The vertical axis represents battery discharge voltage. Threshold values VH, VM, and VL are stored in the non-volatile memory (EEPROM) 56. The threshold value VH is provided for switching from a display showing that "the remaining battery level is sufficiently high" to a display showing that "the remaining battery level is low". The threshold value VM is provided for switching from the display showing that "the remaining battery level is low" to a display showing that "battery replacement is necessary". The threshold value VL is provided for switching from the display showing that "battery replacement is necessary" to a display showing that "the remaining battery level is zero". When the display showing that "the remaining battery level is zero" is performed, the operation of the digital camera is stopped.

The system control circuit 50 determines that the remaining battery level is sufficiently high when the power control part 80 detects that the battery voltage is higher than the threshold value VH. The system control circuit 50 determines that battery replacement is necessary when the power control part 80 detects that the battery voltage is equal to or lower than the threshold value VM. The system control circuit 50 determines that the remaining battery level is zero and stops the operation of the digital camera when the power control part 80 detects that the battery voltage is equal to or lower than the threshold value VL.

In the first exemplary embodiment, the threshold values VH and VM are not fixed but can be set by a user. On the other hand, the threshold value VL is fixed. This is because, if the threshold value VL can be set freely by a user, it is possible to provide a display showing the digital camera is operative even when the normal operation of the digital camera cannot be ensured.

If the threshold values VH and VM can be set with no limitation, some of the displays of the remaining battery level may be skipped or the duration of display of the remaining battery level may be extremely short, for example. This prevents the benefit of the display of the remaining battery level, which impairs the usability of the digital camera. Thus, in the first exemplary embodiment, the allowable setting ranges (hereinafter, also referred to as settable ranges) of the threshold values VH and VM set by a user are limited.

Figure 3:
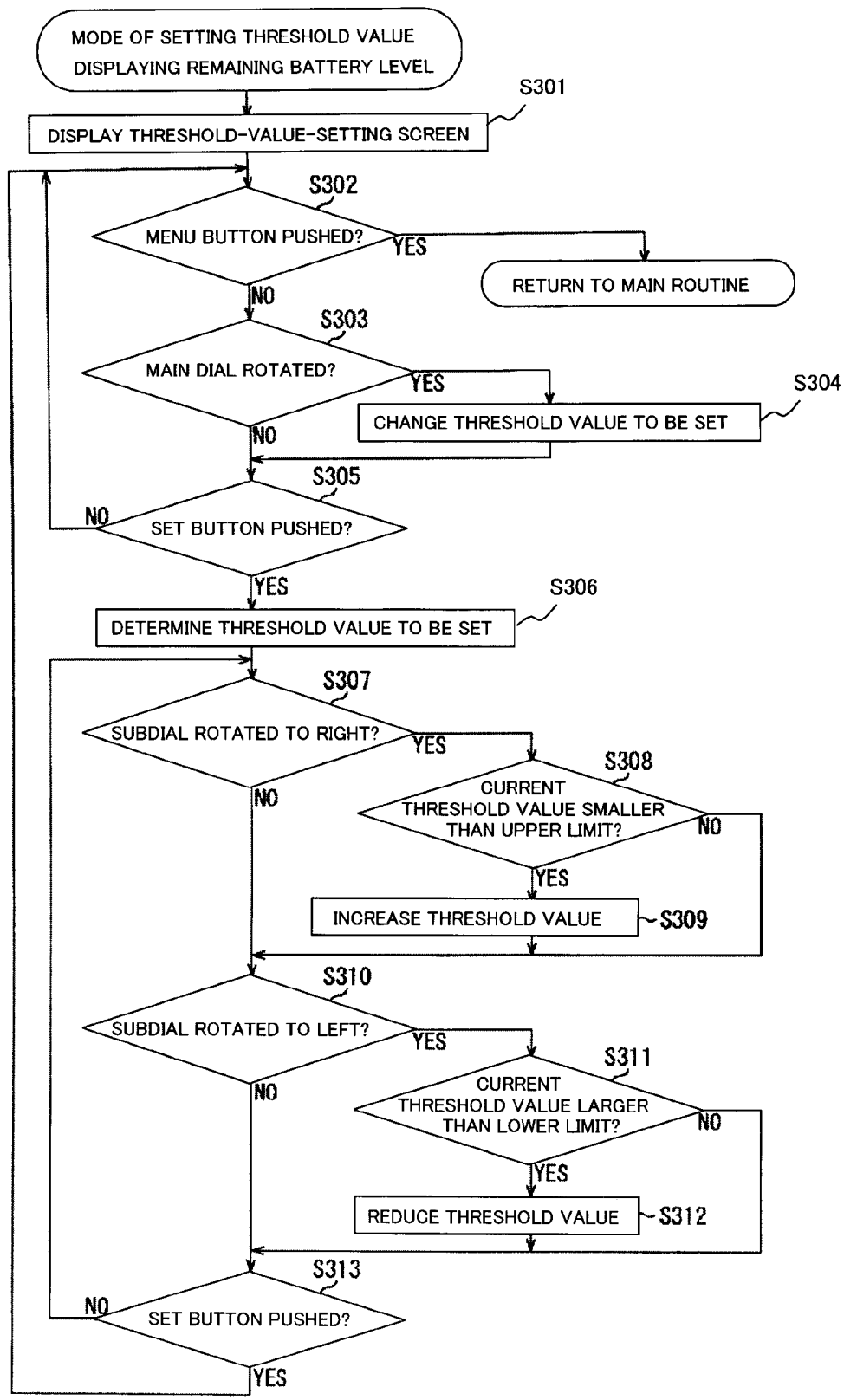
FIG. 3 is a flow chart for explaining the operation of the digital camera in setting a threshold value for switching between displays relating to a remaining battery level according to the first exemplary embodiment of the present invention.

Next, description will be made of an example of operation of the digital camera in setting the threshold values VH and VM for switching between displays relating to the remaining battery level with reference to FIG. 3. The operation (processing) is performed in accordance with the computer programs stored in the system control part 50. This also applies to other alternative embodiments of the present invention which will be described later.

<Initial Display; Step S301>

The system control part 50 provides an instruction to cause the image display part 29 to display a threshold-value-setting screen when a mode of setting a threshold value for displaying a remaining battery level is selected by a user operating the SW operating part 70. Then, the image display part 28 displays the threshold-value-setting screen.

Figure 4A:
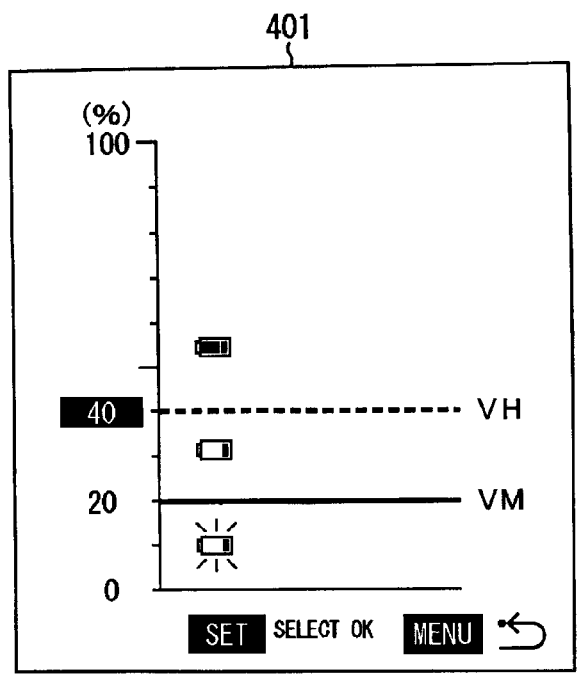
FIGS. 4A and 4B show examples of a threshold-value-setting screen according to the first exemplary embodiment of the present invention.
Figure 4B:
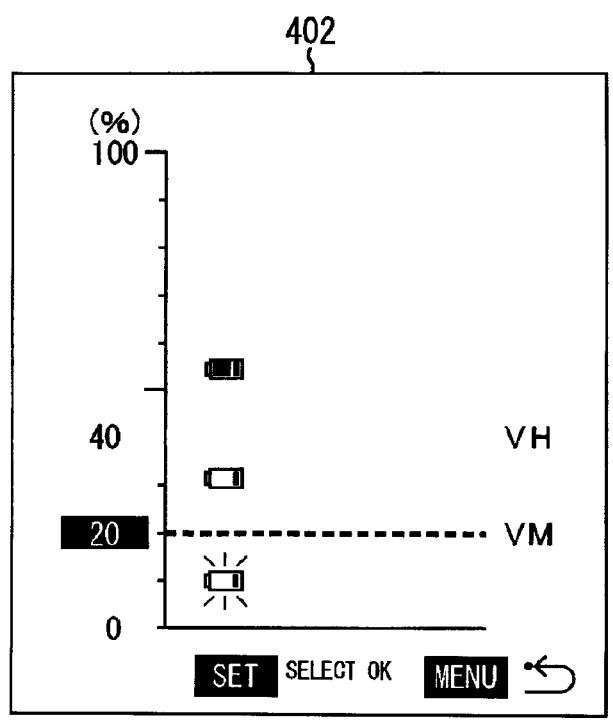

FIGS. 4A and 4B show examples of threshold-value-setting screens 401 and 402. The current levels of the two threshold values (VH and VL, later described) are displayed in bars on threshold-value-setting screens 401 and 402. Specifically, the threshold value which is not a target for setting is displayed in a solid line, while the threshold value which is a target for setting is displayed in a broken line. The value of the threshold value to be set is displayed in the inverted color (in white).

FIG. 4A shows the threshold-value-setting screen 401 in setting the threshold value VH for switching from the display showing that "the remaining battery level is sufficiently high" to the display showing that "the remaining battery level is low". FIG. 4B shows the threshold-value-setting screen 402 in setting the threshold value VM for switching the display showing that "the remaining battery level is low" to the display showing that "battery replacement is necessary".

The system control circuit 50 previously stores a plurality of threshold values and their settable ranges associated with types of batteries. The system control circuit 50 selects one of the threshold values and one of the settable ranges in accordance with the type of the battery loaded in the digital camera body 100 and causes the image display part 28 to display the threshold-value-setting screens 401 and 402 based on the selected value. The type of the battery may be a broad classification such as a primary battery and a secondary battery, but it is preferable to set a specific type of a battery such as an alkaline cell, a NiCd battery, a NiMH battery, and a Li battery.

<Check of Mode of Setting Threshold Value For Displaying Remaining Battery Level; Step S302>

The system control part 50 determines whether or not the user has pushed the MENU button provided for the SW operating part 70. When it is determined that the MENU button has been pushed, the mode of setting the threshold value for displaying the remaining battery level is exited, so that the control returns to the main routine for controlling the general operation of the digital camera. On the other hand, when the MENU button has not been pushed, the process proceeds to step S303 which is processing of selecting the threshold value to be set.

<Selection of Threshold Value to be Set; Step S303>

The system control part 50 determines whether or not the main dial 66 has been rotated by operation of the user. When it is determined that the main dial 66 has been rotated, the process proceeds to step S304 which is processing of switching the threshold value to be set. On the other hand, when the main dial 66 has not been rotated, step S304 is skipped and the process proceeds to step S305.

<Switching of Threshold Value to be Set; Step S304>

The system control part 50 provides an instruction to cause the image display part 28 to display the threshold value to be set in accordance with the operation of the main dial 66 by the user. This causes the image display part 28 to change the display on the threshold-value-setting screen.

For example, when the threshold value VH is the target for setting as shown in FIG. 4A, the main dial 66 is clicked once. This causes the threshold value VM to be selected as the target for setting as shown in FIG. 4B. Every time the main dial 66 is clicked, the target for setting is switched between the threshold values VH and VM.

<Determination of Threshold Value to be Set; Step S305>

The system control part 50 determines whether or not the user has pushed the SET button provided for the SW operating part 70. When it is determined that the SET has been pushed, the process proceeds to step S306 which is processing of determining the threshold value to be set. On the other hand, when the SET button has not been pushed, the selection of the threshold value to be set is continued, so that the control returns to Step S302.

<Determination of Threshold Value to be Set; Step S306>

The system control part 50 determines the currently selected threshold value as the threshold value to be set, and enters a mode for setting the numeric value of the threshold value.

Figure 5A:
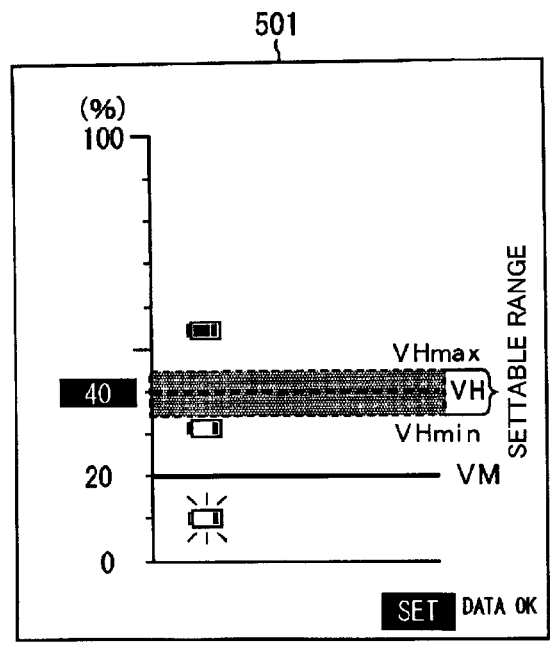
FIGS. 5A and 5B show examples of a threshold-value-setting screen after a threshold value is determined according to the first exemplary embodiment of the present invention.
Figure 5B:
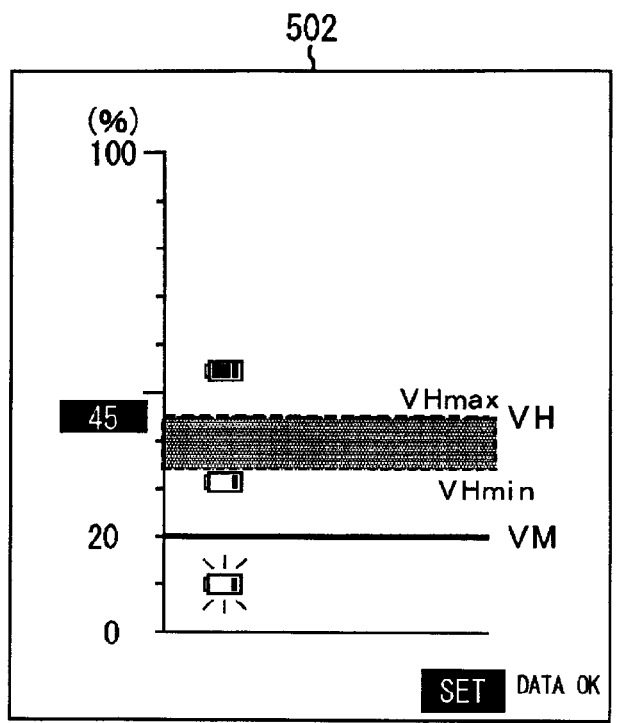

FIGS. 5A and 5B shows examples of threshold-value-setting screens 501 and 502 when the threshold value VH is determined as the threshold value to be set. In the threshold-value-setting screen 501 in FIG. 5A, the current value of the threshold value VH is 40% and the settable range of the threshold value VH ranges from the lower limit VHmin to the upper limit VHmax. In the threshold-value-setting screen 502 in FIG. 5B, the current value of the threshold value VH is at the upper limit VHmax (45%).

<Operation to Increase Threshold Value; Step S307>

The system control part 50 determines whether or not the sub dial 68 has been rotated to the right (one step rotation in a clockwise direction) by operation of the user. When it is determined that the sub dial 68 has been rotated to the right, the process proceeds to step S308. On the other hand, when the sub dial 68 has not been rotated to the right, the process proceeds to step S310.

<Determination Of Upper Limit Of Threshold Value; Step S308>

The system control part 50 determines whether or not the current threshold value to be set is smaller than the upper limit VHmax. When it is determined that the current threshold value to be set is smaller than the upper limit VHmax, the process proceeds to step S309 since the threshold value can be increased. At step S309, the system control part 50 increases the threshold value by one step. The system control part 50 provides an instruction to change the displayed position of the threshold value and updates the threshold value stored in the non-volatile memory (EEPROM) 56. This causes the position of the threshold value displayed in the broken line to be moved upward.

On the other hand, when the current threshold value to be set is not smaller than the upper limit VHmax, the threshold value cannot be increased, so that step S309 is omitted and the process proceeds to step S310. For example, when the threshold value VH is at the upper limit VHmax as shown in FIG. 5B, the value is not increased.

<Operation to Reduce Threshold Value; Step S310>

The system control part 50 determines whether or not the sub dial 68 has been rotated to the left (one step rotation in a counterclockwise direction) by operation of the user. When it is determined that the sub dial 68 has been rotated to the left, the process proceeds to step S311. On the other hand, when the sub dial 68 has not been rotated to the left, the process proceeds to step S313.

<Determination of Lower Limit of Threshold Value; Step S311>

The system control part 50 determines whether or not the current threshold value to be set is larger than the lower limit VHmin. When it is determined that the current threshold value to be set is larger than the lower limit VHmin, the process proceeds to step S312 since the threshold value can be reduced. At step S312, the system control part 50 reduces the threshold value by one step. The system control part 50 provides an instruction to change the displayed position of the threshold value and updates the threshold value stored in the non-volatile memory (EEPROM) 56. This causes the position of the threshold value displayed in the broken line to be moved downward.

On the other hand, when the current threshold value to be set is not larger than the lower limit VHmin, the threshold value cannot be reduced, so that step S312 is omitted and the process proceeds to step S313.

<Determination of Threshold Value; Step S313>

The system control circuit 50 determines whether or not the SET button provided for the SW operating part 70 has been pushed by the user. When it is determined that the SET button has been pushed, the changed threshold value is determined as the threshold value stored in the non-volatile memory (EEPROM) 56 and the control returns to step S302. On the other hand, when the SET button has not been pushed, the process proceeds to step S307 since the setting of the threshold value is continued.

The system control circuit 50 compares the threshold values VH and VM set as described above with the remaining battery level detected by the power control part 80, and based on the comparison result, determines in which state the remaining battery level is, for example of the four states shown in FIG. 2. The system control circuit 50 causes the display part 54 to display information on the remaining battery level in accordance with the determination result. The display of the information on the remaining battery level is performed as shown in FIGS. 9A to 9D, for example.

As described above, in the first exemplary embodiment, the threshold-value-setting screens 401, 402, 501, and 502 are displayed in the image display part 28 provided on the back of the camera. The threshold value to be set is displayed in the broken line, while the threshold value not to be set is displayed in the solid line. The user uses the threshold-value-setting screen 401 to set the threshold value VH for switching from the display showing that "the remaining battery level is sufficiently high" to the display showing that "the remaining battery level is low". The user uses the threshold-value-setting screen 402 to set the threshold value VM for switching from the display showing that "the remaining battery level is low" to the display showing that "battery replacement is necessary".

Thus, the user can set the voltage value of the battery at which the displays of the remaining battery level are switched. This can achieve the display of the remaining battery level that matches the preference of the user. For example, a user who wishes to change the battery when the remaining battery level is high can set a large value as the threshold value VM. On other hand, a user who wishes to change the battery only after the remaining battery level is low can set a small value as the threshold value VM.

The settable ranges of the threshold values VH and VM are displayed as the threshold-value-setting screens 501 and 502 shown in FIGS. 5A and 5B and the threshold values VH and VM are set within those settable ranges. As a result, the user can arbitrarily set within the settable ranges the voltage value of the battery at which the displays of the remaining battery level are switched. This can prevent skipping of some of the displays of the remaining battery level or an extremely short duration of display of the remaining battery level from impairing the benefit of the display of the remaining battery level.

In the first exemplary embodiment, the threshold value VL cannot be set or changed. This can avoid a display showing that the digital camera is operative even when the normal operation of the digital camera cannot be ensured, thereby making it possible to prevent a contradiction between the actual remaining battery level and the display of the remaining battery level.

If the threshold value VL is settable by a user, it is preferable that the lower limit of the settable range of the threshold value VL is equal to or higher than the minimum voltage for proper operation of the digital camera and that the settable upper limit is set such that no contradiction occurs between the actual remaining battery level and the display of the remaining battery level.

The first exemplary embodiment has been described with the digital camera taken as an example of the electronic apparatus. However, an alternative embodiment of the present invention includes any electronic apparatus as long as it can operate on a battery and display a graphical image on a display device. This applies to a second embodiment described later.

In the first exemplary embodiment, the two threshold values (the threshold values VH and VM) can be set by the user. However, the threshold values settable by the user are not limited to two. As the user can set more threshold values, the remaining battery level can be displayed more accurately.

In addition, as described above, the settable ranges of the threshold values VH and VM are preferably defined. However, the settable ranges may not be necessarily provided.

Also in the first exemplary embodiment, the threshold values VH and VM can be set by the user with the operation member such as the button and the dial. The threshold values VH and VM may be changed with a touch panel by a user, for example.

Moreover, a plurality of threshold values and their settable ranges are previously stored in association with the types of batteries. However, a plurality of thresholds and their settable ranges may be stored in association with the model names of batteries.

Second Exemplary Embodiment

Next, a second exemplary embodiment of the present invention will be described. The second embodiment differs from the first embodiment in part of the setting method of the threshold values VH and VM for switching between displays relating to the remaining battery level. Thus, in the following description, portions similar to those of the first exemplary embodiment are designated with the same reference numerals used in the first embodiment and detailed description thereof is omitted.

Figure 6:
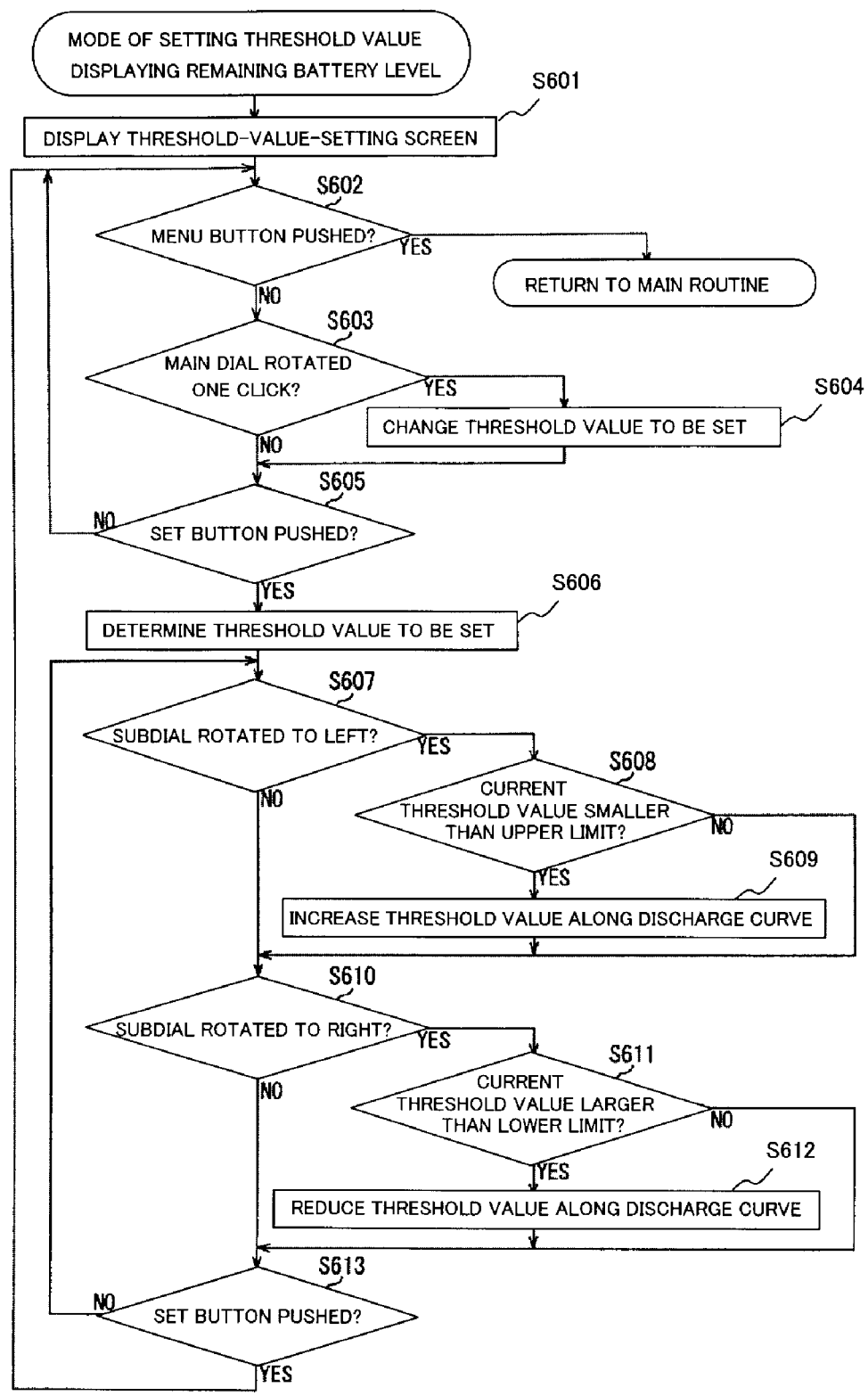
FIG. 6 is a flow chart for explaining the operation in setting a threshold value for switching between displays relating to a remaining battery level in a digital camera according to a second exemplary embodiment of the present invention.

FIG. 6 is a flow chart for explaining an example of operation of a digital camera in setting threshold values VH and VM for switching between displays relating to the remaining battery level. In Embodiment 2, the threshold values VH and VM for switching between displays relating to the remaining battery level are set along a discharge characteristic curve (discharge curve) of a battery.

<Initial Display; Step S601>

Figure 7A:
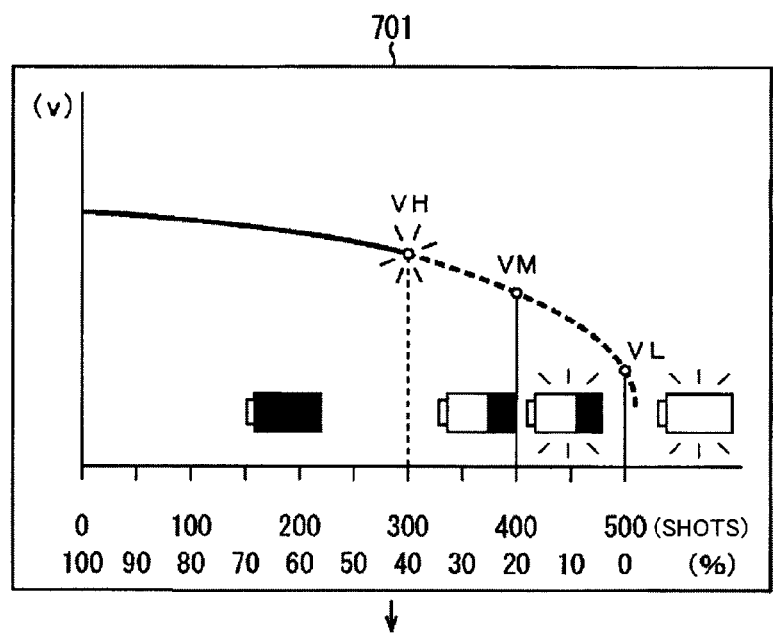
FIGS. 7A and 7B show examples of a threshold-value-setting screen according to the second exemplary embodiment of the present invention.
Figure 7B:
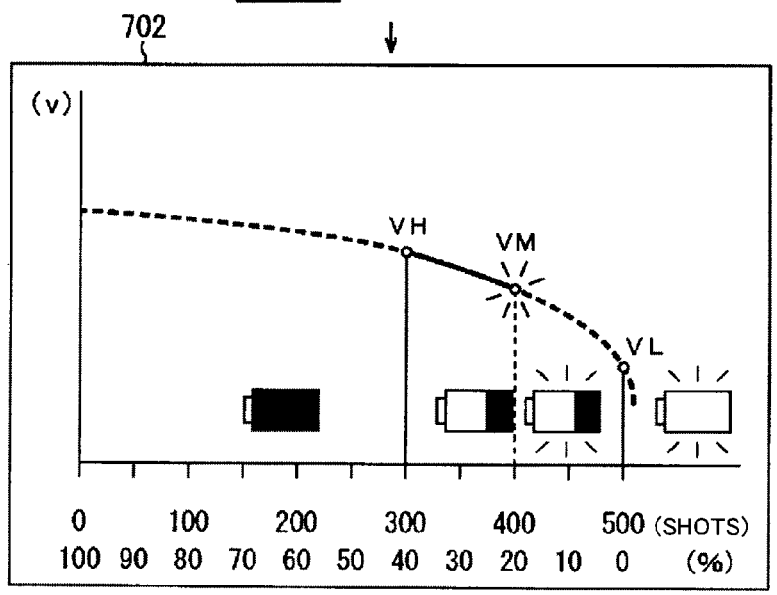

A system control part 50 provides an instruction to cause an image display part 28 to display a threshold-value-setting screen when a mode of setting a threshold value for displaying a remaining battery level is selected by a user operating a SW operating part 70. Then, the image display part 28 displays the threshold-value-setting screen. FIGS. 7A and 7B show examples of threshold-value-setting screens 701 and 702.

As shown in FIGS. 7A and 7B, a discharge curve (discharge characteristic curve) is displayed on the threshold-value-setting screens 701 and 702. The horizontal axis in the discharge curve represents the number of picked-up images (shots). Under the number of picked-up images, the proportion of the possible number of picked-up images to the total number of picked-up images is shown in percentage (%). On the other hand, the vertical axis in the discharge curve represents a battery discharge voltage.

The current levels of the two threshold values VH and VL are displayed on the battery discharge curve in the threshold-value-setting screens 701 and 702. Specifically, the threshold value to be set flashes, while the threshold value not to be set is displayed normally.

FIG. 7A shows the threshold-value-setting screen 701 in setting the threshold value VH for switching from a display showing that "the remaining battery level is sufficiently high" to a display showing that "the remaining battery level is low". FIG. 7B shows the threshold-value-setting screen 702 in setting the threshold value VM for switching from the display showing that "the remaining battery level is low" to a display showing that "battery replacement is necessary".

As in the first embodiment, the system control circuit 50 previously stores a plurality of threshold values and their settable ranges associated with types of batteries or the like. The system control circuit 50 selects one of the threshold values and one of the settable ranges in accordance with the battery loaded in a digital camera body 100 and displays the threshold-value-setting screens 701 and 702 based on the selected value. In the second embodiment, the system control circuit 50 also stores previously a plurality of discharge curves associated with types of batteries. The system control circuit 50 selects one of the discharge curves in accordance with the battery loaded in the digital camera body 100 and displays the threshold-value-setting screens 701 and 702 based on the selected discharge curve.

<Check of Mode of Setting Threshold Value for Displaying Remaining Battery Level; Step S602>

The system control part 50 determines whether or not a user has pushed a MENU button provided for the SW operating part 70. When it is determined that the MENU button has been pushed, the mode of setting the threshold value for displaying the remaining battery level is exited, so that the control returns to the main routine for controlling the general operation of the digital camera. On the other hand, when the MENU button has not been pushed, the process proceeds to step S603 which is processing of selecting the threshold value to be set.

<Selection of Threshold Value To be Set; Step S603>

The system control part 50 determines whether or not a main dial 66 has been rotated by operation of the user. When it is determined that the main dial 66 has been rotated, the process proceeds to step S604 which is processing of switching the threshold value to be set. On the other hand, when the main dial 66 has not been rotated, step S604 is skipped and the process proceeds to step S605.

<Switching of Threshold Value to be Set; Step S604>

The system control part 50 provides an instruction to display the threshold value to be set in accordance with the operation of the main dial 66 by the user. This causes the image display part 28 to change the display on the threshold-value-setting screen.

For example, when the threshold value VH is the target for setting as shown in FIG. 7A, the main dial 66 is clicked once. This causes the threshold value VM to be selected as the target for setting as shown in FIG. 7B. Every time the main dial 66 is clicked, the target for setting is switched between the threshold values VH and VM.

<Determination of Threshold Value to be Set; Step S605>

The system control part 50 determines whether or not the user has pushed a SET button provided for the SW operating part 70. When it is determined that the SET has been pushed, the process proceeds to step S606 which is processing of determining the threshold value to be set. On the other hand, when the SET button has not been pushed, the selection of the threshold value to be set is continued, so that the control returns to Step S602.

<Determination of Threshold Value to be Set; Step S606>

The system control part 50 determines the currently selected threshold value as the threshold value to be set, and enters a mode for setting the numeric value of the threshold value.

Figure 8A:
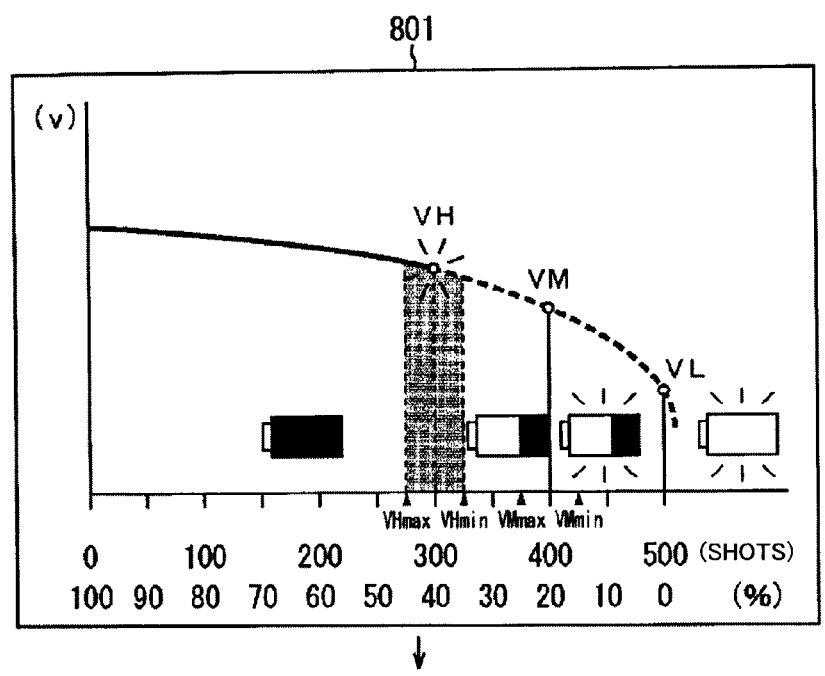
FIGS. 8A and 8B show examples of a threshold-value-setting screen after a threshold value according to the second exemplary embodiment.
Figure 8B:
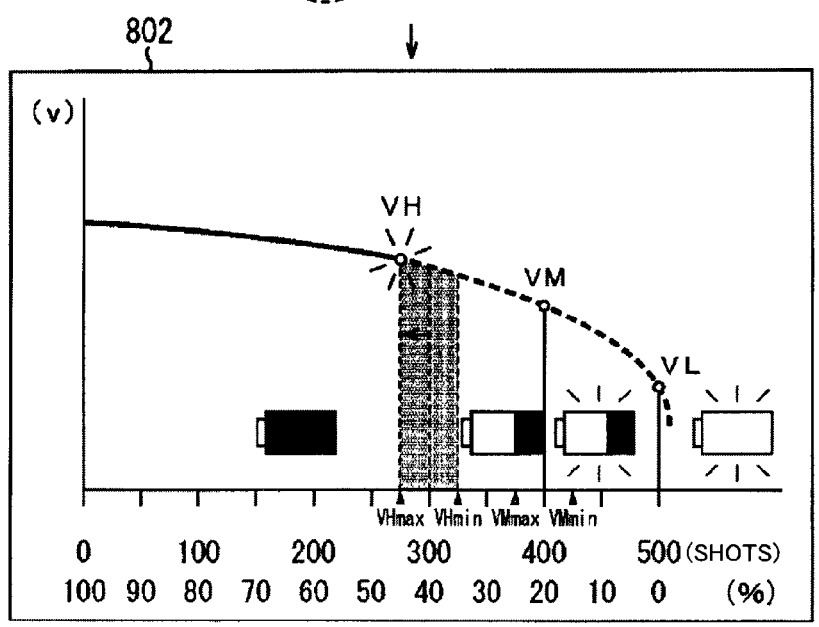

FIGS. 8A and 8B shows examples of threshold-value-setting screens 801 and 802 after the threshold value to be set is determined. In particular, FIGS. 8A and 8B shows the threshold-value-setting screens 801 and 802 when the threshold value VH for switching from the display showing that "the remaining battery level is sufficiently high" to the display showing that "the remaining battery level is low" is determined as the threshold value to be set. In the threshold-value-setting screen 801 in FIG. 8A, the current value of the threshold value VH is 40% and the image representing the threshold value VH flashes on the discharge curve. The screen 801 also shows that the settable range of the threshold value VH ranges from the lower limit VHmin to the upper limit VHmax.

As described in the first embodiment, if the settable range of the threshold value is not limited, some of the displays of the remaining battery level may be skipped or the duration of display of the remaining battery level may be extremely short. This prevents the benefit of the display of the remaining battery level to reduce the usability of the digital camera. Thus, in the second embodiment, the settable range is limited.

For example, as shown in FIG. 8A, the basic setting value of the threshold value VH is 40% of the remaining battery level, and ±5% is defined as the settable range. In other words, the settable range of the threshold value VH is from 35% to 45% of the remaining battery level. In FIG. 8B, the basic setting value of the threshold value VM is 20% of the remaining battery level, and ±5% is defined as the settable range. In other words, the settable range of the threshold value VM is from 15% to 25% of the remaining battery level.

<Operation to Increase Threshold Value; Step S607>

The system control part 50 determines whether or not the sub dial 68 has been rotated to the left (one step rotation in a counterclockwise direction) by operation of the user. When it is determined that the sub dial 68 has been rotated to the left, the process proceeds to step S608. On the other hand, when the sub dial 68 has not been rotated to the left, the process proceeds to step S610.

<Determination of Upper Limit of Threshold Value; Step S608>

The system control part 50 determines whether or not the current threshold value to be set is smaller than the upper limit VHmax. When it is determined that the current threshold value to be set is smaller than the upper limit VHmax, the process proceeds to step S609 since the threshold value can be increased. At step S609, the system control part 50 increases the threshold value by one step. The system control part 50 provides an instruction to change the displayed position of the threshold value and updates the threshold value stored in a non-volatile memory (EEPROM) 56. This causes the position of the flashing image representing the threshold value to be moved leftward along the discharge curve.

On the other hand, when the current threshold value to be set is not smaller than the upper limit VHmax, the threshold value cannot be increased, so that step S609 is omitted and the process proceeds to step S610. For example, when the threshold value VH is at the upper limit VHmax as shown in FIG. 8B, the value is not increased.

<Operation to Reduce Threshold Value; Step S610>

The system control part 50 determines whether or not the sub dial 68 has been rotated to the right (one step rotation in a clockwise direction) by operation of the user. When it is determined that the sub dial 68 has been rotated to the right, the process proceeds to step S611. On the other hand, when the sub dial 68 has not been rotated to the right, the process proceeds to step S613.

<Determination of Lower Limit of Threshold Value; Step S611>

The system control part 50 determines whether or not the current threshold value to be set is larger than the lower limit VHmin. When it is determined that the current threshold value to be set is larger than the lower limit VHmin, the process proceeds to step S612 since the threshold value can be reduced. At step S612, the system control part 50 reduces the threshold value by one step. The system control part 50 provides an instruction to change the displayed position of the threshold value and updates the threshold value stored in the non-volatile memory (EEPROM) 56. This causes the position of the flashing image representing the threshold value to be moved rightward along the discharge curve.

On the other hand, when the current threshold value to be set is not larger than the lower limit VHmin, the threshold value cannot be reduced, so that step S612 is omitted and the process proceeds to step S613.

<Determination of Threshold Value; Step S613>

The system control circuit 50 determines whether or not the SET button provided for the SW operating part 70 has been pushed by the user. When it is determined that the SET button has been pushed, the changed threshold value is determined as the threshold value stored in the non-volatile memory (EEPROM) 56 and the process proceeds to step S602. On the other hand, when the SET button has not been pushed, the process proceeds to step S607 since the setting of the threshold value is continued.

As described above, in Embodiment 2, the threshold-value-setting screens 701, 702, 801, and 802 are displayed in the image display part 28 provided on the back of the camera. The discharge curve for the battery loaded in the digital camera is displayed graphically, and the images representing the threshold values are displayed on the discharge curve. The image representing the threshold value to be set is flashed. Then, when the user performs operation to change the threshold value, the position of the flashing image is moved along the discharge curve. Consequently, in addition to the advantages described in the first embodiment, the second embodiment allows the user to set the threshold value with good viewability.

In the second embodiment, the vertical axis in the discharge curve shown in the threshold-value-setting screen represents the battery discharge voltage and the horizontal axis represents the number of picked-up images. However, the discharge curve may not been necessarily plotted with such parameters. For example, the horizontal axis in the discharge curve may represent a discharge capacity. Alternatively, the vertical axis may represent the number of picked-up images and the horizontal axis may represent the battery discharge voltage in view of space for display.

As described above, the displayed position of the image representing the threshold value to be set is preferably moved along the discharge curve, but this is not essential. For example, the threshold value may be displayed in digital form together with the discharge curve, and the threshold value in digital form may be changed.

In addition, a plurality of discharge curves may be stored, for example in association with the model names of batteries, not with the types of batteries.

it is further noted that the various modifications described in with regard to the first exemplary embodiment, may also be applied to the second embodiment.

Furthermore, the present invention is not limited to these embodiments and various variations and modifications may be made without departing from the scope of the present invention.

This application claims foreign priority benefits based on Japanese Patent Application No. 2006-251153, filed on Sep. 15, 2006, which is hereby incorporated by reference herein in its entirety as if fully set forth herein.

What is claimed is:

1. An electronic which is supplied an electric power from a battery, comprising:
    a detector which detects a remaining battery level of the battery;
    a display device which displays a battery icon representing the remaining battery level;
    a controller which controls the display device so that the battery icon changes a first state into a second state when the remaining battery level detected by the detector is lower than a threshold value; and
    a changing unit which changes the threshold value in accordance with a change instruction of a user;
    wherein the controller controls the display device so that a character of the threshold value and a discharge characteristic graph of the battery are displayed together on the display device when the changing unit accepts the change instruction of the user to change the threshold value.

2. The electronic apparatus according to claim 1,
    wherein the character of the threshold value is located on the discharge characteristic graph, and
    wherein the character of the threshold value moves along the discharge characteristic graph in accordance with the change instruction of the user.

3. The electronic apparatus according to claim 1, further comprising:
    a determining unit which determines type of the battery; and
    a memory which stores a plurality of discharge characteristic graphs associated with types of batteries,
    wherein the controller selects a discharge characteristic graph associated with the determined type of the battery from a plurality of discharge characteristic graphs, and
    wherein the controller controls the display device so as to display the discharge characteristic graph associated with the determined type of the battery.

4. A method of displaying a remaining battery level in an electronic apparatus which is supplied an electric power from a battery, the method comprising:
    detecting a remaining battery level of the battery;
    displaying on a display device a battery icon representing the remaining battery level;
    changing the battery icon in a first state into a second state when the detected remaining battery level is lower than a threshold value; and
    changing the threshold value in accordance with a change instruction of a user, wherein a character of the threshold value which is set and a discharge characteristic graph of the battery are displayed together on the display device when the changing unit can accept the change instruction of the user to change the threshold value.

5. The method according to claim 4,
    wherein the character of the threshold value is located on the discharge characteristic graph, and
    wherein the character of the threshold value moves along the discharge characteristic graph in accordance with the change instruction of the user.

6. The method according to claim 4, further comprising:
    determining type of the battery; and
    selecting a discharge characteristic graph associated with the determined type of the battery from a plurality of discharge characteristic graphs,
    wherein the discharge characteristic graph associated with the determined type of the battery is displayed on the display device.

* * * * *